United States Patent
Lee

(10) Patent No.: US 10,109,360 B2
(45) Date of Patent: Oct. 23, 2018

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/625,162

(22) Filed: Jun. 16, 2017

(65) Prior Publication Data

US 2018/0068740 A1    Mar. 8, 2018

(30) Foreign Application Priority Data

Sep. 6, 2016   (KR) .................. 10-2016-0114649

(51) Int. Cl.
| | | |
|---|---|---|
| *G11C 16/26* | (2006.01) | |
| *G11C 16/34* | (2006.01) | |
| *G11C 16/14* | (2006.01) | |

(52) U.S. Cl.
CPC .......... *G11C 16/3459* (2013.01); *G11C 16/14* (2013.01); *G11C 16/26* (2013.01)

(58) Field of Classification Search
CPC ................................ G11C 16/26; G11C 16/10
USPC ....................................... 365/185.11, 185.24
See application file for complete search history.

(56) References Cited

U.S. PATENT DOCUMENTS

| | | | | |
|---|---|---|---|---|
| 5,233,562 A * | 8/1993 | Ong | ....................... | G11C 16/14 365/185.22 |
| 5,272,669 A * | 12/1993 | Samachisa | .......... | G11C 11/5621 365/185.03 |
| 5,694,366 A * | 12/1997 | Chevallier | ............. | G11O 5/143 330/282 |
| 7,136,304 B2 * | 11/2006 | Cohen | ................. | G11C 11/5628 365/185.19 |
| 7,649,782 B2 * | 1/2010 | Eguchi | ............... | G11C 16/3409 365/185.09 |
| 7,692,961 B2 * | 4/2010 | Eitan | ..................... | H01L 29/792 365/185.02 |
| 7,804,718 B2 * | 9/2010 | Kim | .................... | G11C 16/0483 365/185.11 |
| 8,159,877 B2 * | 4/2012 | Poplevine | .............. | G11C 16/06 365/185.05 |
| 8,901,634 B2 * | 12/2014 | La Rosa | ............. | H01L 29/7889 257/321 |
| 9,595,345 B2 * | 3/2017 | Mui | ................... | G11C 16/3459 |

(Continued)

*Primary Examiner* — Michael Tran
(74) *Attorney, Agent, or Firm* — William Park & Associates Ltd.

(57) ABSTRACT

A semiconductor memory device includes a memory cell array, a read/write circuit and a control logic. The memory cell array includes a plurality of memory cells. The read/write circuit is configured to write data to the memory cell array or read data from the memory cell array. The control logic is configured to control the read/write circuit to perform a read/write operation for the memory cell array. The memory cell array includes a plurality of memory blocks, and each of the memory blocks includes a plurality of sub-blocks. During an operation of erasing a sub-block in a memory block, the control logic selects a sub-block to be erased regardless of a sequence in which the sub-blocks have been programmed, and determines an erase verify voltage based on a position of the selected sub-block.

17 Claims, 8 Drawing Sheets

(56) References Cited

U.S. PATENT DOCUMENTS

| | | | |
|---|---|---|---|
| 9,721,664 B2* | 8/2017 | Nam | G11C 16/10 |
| 9,859,007 B2* | 1/2018 | Suzuki | G11C 16/10 |
| 2005/0144358 A1* | 6/2005 | Conley | G06F 12/0246 |
| | | | 711/103 |
| 2011/0040930 A1* | 2/2011 | Shin | G06F 12/0246 |
| | | | 711/103 |
| 2014/0133232 A1* | 5/2014 | Avila | G11C 16/0483 |
| | | | 365/185.11 |
| 2014/0136765 A1* | 5/2014 | Oh | G11C 16/0483 |
| | | | 711/103 |
| 2014/0325118 A1* | 10/2014 | Cheng | G06F 12/0246 |
| | | | 711/103 |

* cited by examiner

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0114649 filed on Sep. 6, 2016, which is incorporated herein by reference in its entirety.

BACKGROUND

1. Technical Field

Various embodiments of the present disclosure relate to a semiconductor memory device and a method of operating the same, and more particularly, to a semiconductor memory device in which sub-blocks are included in a memory block, and a method of operating the same.

2. Related Art

Semiconductor memory devices are memory devices realized using a semiconductor made up of, for example, silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

Various embodiments of the present disclosure are directed to a semiconductor memory device capable of removing a limit in selecting a target sub-block to be erased.

Furthermore, various embodiments of the present disclosure are directed to a method of operating a semiconductor memory device which is capable of removing a limit in selecting a target sub-block to be erased.

In one aspect of the present disclosure, there is provided a semiconductor memory device including: a memory cell array including a plurality of memory cells; a read/write circuit configured to write data to the memory cell array or read data from the memory cell array; and a control logic configured to control the read/write circuit to perform a read/write operation for the memory cell array, wherein the memory cell array includes a plurality of memory blocks, and each of the memory blocks includes a plurality of sub-blocks, and wherein, during an operation of erasing a sub-block in a memory block, the control logic selects a sub-block to be erased regardless of a sequence in which the sub-blocks have been programmed, and determines an erase verify voltage based on a position of the selected sub-block.

In another aspect of the present disclosure, there is provided a method for operating a semiconductor memory device including a plurality of memory blocks each of which is divided into a plurality of sub-blocks, the method including: determining a target memory block to be erased; determining a target sub-block to be erased in the determined memory block; determining an erase verify voltage of the determined sub-block; and erasing the determined sub-block using the determined erase verify voltage.

BRIEF DESCRIPTION OF THE DRAWINGS

Example embodiments will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present. Like reference numerals refer to like elements throughout.

DETAILED DESCRIPTION

Figure 1:
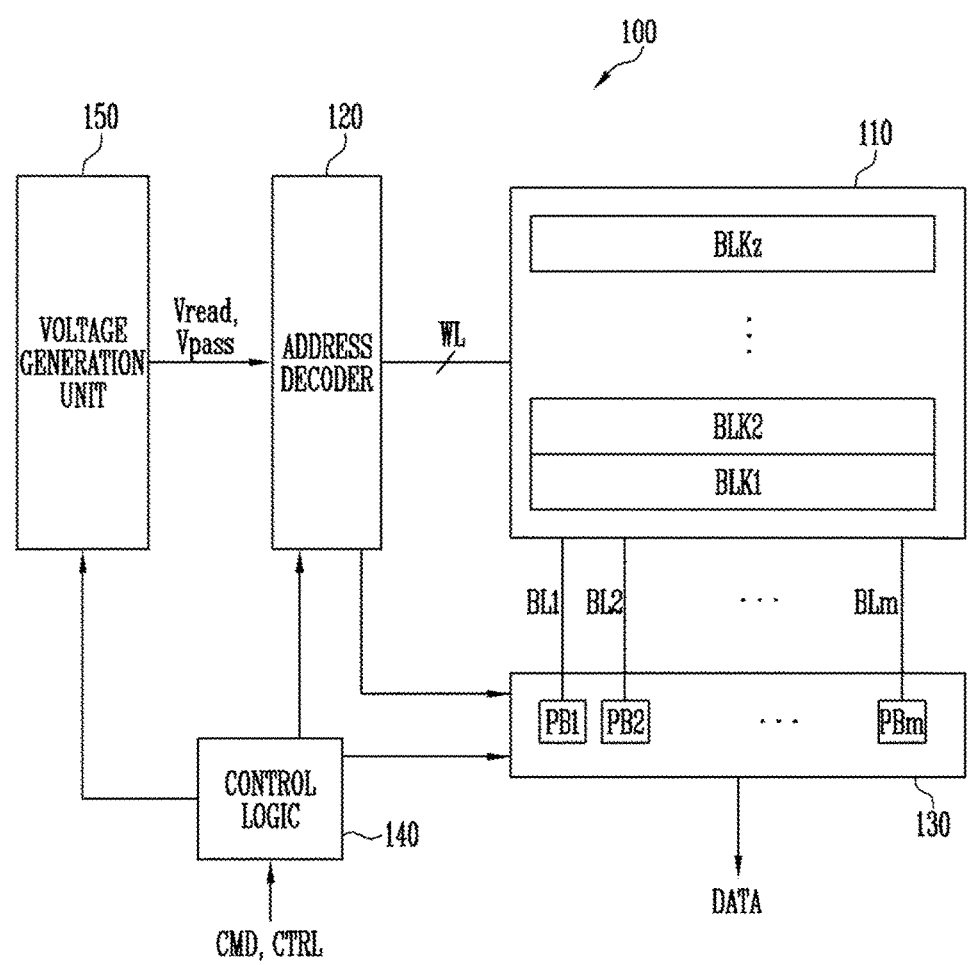
FIG. 1 is a block diagram illustrating a semiconductor memory device in accordance with an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but these terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as the form is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device in accordance with an embodiment of the present disclosure.

Referring to FIG. 1, a semiconductor memory device 100 includes a memory cell array 110, an address decoder 120, a read/write circuit 130, a control logic 140, and a voltage generation unit 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the plurality of memory cells may be nonvolatile memory cells and may be configured with the nonvolatile memory cells having a vertical channel structure. The memory cell array 110 may be formed having a two-dimensional structure. In an embodiment, the memory cell array 110 may be formed having a three-dimensional structure. In an embodiment of the present disclosure, each of the memory blocks BLK1 to BLKz included in the memory cell array 110 may include a plurality of sub-blocks. For example, each of the memory blocks BLK1 to BLKz may include two sub-blocks. In another example, each of the memory blocks BLK1 to BLKz may include four sub-blocks. According to the semiconductor memory device and a method of operating the same in accordance with an embodiment of the present disclosure, the number of sub-blocks included in each memory block is not limited. Thus, various numbers of sub-blocks may be included in each memory block. Each of the memory cells included in a memory cell array may store at least one bit of data. In an embodiment, each of the memory cells included in the memory cell array 110 may be a single-level cell (SLC), which stores 1-bit data. Alternatively, each of the memory cells included in the memory cell array 110 may be a multi-level cell (MLC), which stores 2-bit data. Further, each of the memory cells included in the memory cell array 110 may be a triple-level MLC, which stores 3-bit data. Further still, each of the memory cells included in the memory cell array 110 may be a quad-level MLC, which stores 4-bit data. In various embodiments, the memory cell array 110 may include a plurality of MLCs each of which stores 5 or more bits of data.

The address decoder 120, the read/write circuit 130, and the control logic 140 function as a peripheral circuit for driving the memory cell array 110. The address decoder 120 is coupled to the memory cell array 110 through the word lines WL. The address decoder 120 is configured to operate in response to control of the control logic 140. The address decoder 120 receives addresses through an input/output buffer (not shown) provided in the semiconductor memory device 100.

The address decoder 120 is configured to decode a block address among the received addresses. The address decoder 120 selects at least one memory block in response to the decoded block address. When a read voltage application operation is performed during a read operation, the address decoder 120 may apply a read voltage Vread generated from the voltage generation unit 150 to a selected word line of a selected memory block, and the address decoder 120 may apply a pass voltage Vpass to the other unselected word lines. During a program verify operation, the address decoder 120 may apply an erase verify voltage generated from the voltage generation unit 150 to a selected word line of a selected memory block, and the address decoder 120 may apply a pass voltage Vpass to the other unselected word lines.

The address decoder 120 is configured to decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address, and a column address. The address decoder 120 selects one memory block and one word line in accordance with a block address and a row address. The column address is decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation of the memory cell array 110. The plurality of page buffers PB1 to PBm are coupled to the memory cell array 110 through the bit lines BL1 to BLm. During a read or program operation, to sense threshold voltages of the memory cells, the page buffers PB1 to PBm may continuously supply sensing current to the bit lines BL1 to BLm coupled to the memory cells, and each page buffer PB1 to PBm may sense, through a sensing node, a change in the amount of current flowing depending on a program state of a corresponding memory cell and latch it as sensing data. The read/write circuit 130 is operated in response to page buffer control signals outputted from the control logic 140.

During a read operation, the read/write circuit 130 may sense data of the memory cells and temporarily store readout data, and then output data DATA to the input/output buffer (not shown) of the semiconductor memory device 100. In an embodiment, the read/write circuit 130 may include a column select circuit or the like as well as the page buffers (or page resistors).

The control logic 140 is coupled to the address decoder 120, the read/write circuit 130, and the voltage generation unit 150. The control logic 140 may receive a command CMD and a control signal CTRL through the input/output buffer (not shown) of the semiconductor memory device 100. The control logic 140 is configured to control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read or write operation of the memory cell array 110.

The voltage generator 150 generates a read voltage Vread and a pass voltage Vpass during a read operation in response to a voltage generation unit control signal outputted from the control logic 140.

Figure 2:
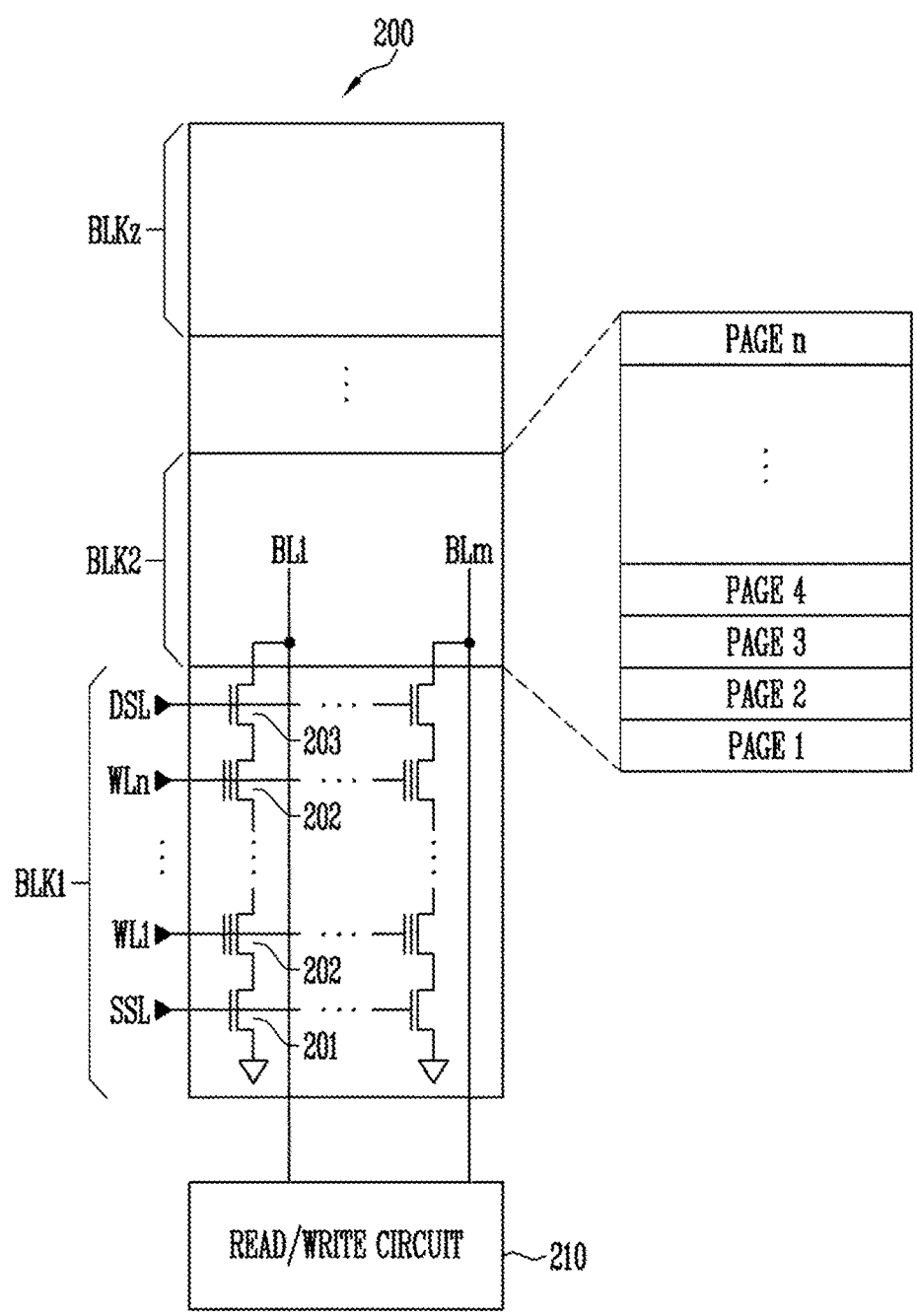
FIG. 2 is a diagram schematically illustrating a configuration of a memory block of the memory cell array shown in FIG. 1.

FIG. 2 is a diagram schematically illustrating a configuration of a memory block of the memory cell array shown in FIG. 1. The memory cell array 200 includes a plurality of memory blocks BLK1 to BLKz. Each of the memory blocks is configured with pages which are separated from each other by word lines WL0 to WLn. That is, page 1 corresponds to the first word line WL1, and page 2 corresponds to the second word line WL2, etc. Likewise, page n correspond to an n-th word line. In FIG. 2, both 'n' and 'z' are natural numbers. Each of the pages corresponds to a row of memory cells coupled to a common word line.

Each of the memory blocks is configured with memory cell strings each of which includes a plurality of memory cells 202 which are arranged in series and electrically coupled to each other. Therefore, the word lines WL1 to WLn are coupled to gates of the corresponding memory cells 202 included in each of the memory cell strings. A source select transistor 201 is coupled to a memory cell 202 that is coupled to the first word line WL1. A source select line SSL is coupled to a gate electrode of the source select transistor 201. A drain select transistor 203 is coupled to a memory cell 202 that is coupled to the n-th word line WLn. A drain select line DSL is coupled to a gate electrode of the drain select transistor 203. The read/write circuit 210 is coupled with bit lines BL1 to BLm.

The bit lines (BL0 to BLm, where m is an integer other than 0) are common to the memory blocks BLK1 to BLKz. Each of the bit lines is coupled to one cell string of each of the memory blocks BLK1 to BLKz.

The read/write circuit 210 reads data from the memory cells 202 or writes data to the memory cells 202. In an embodiment, each memory cell 202 may be formed of an MLC. In the case of a memory cell which stores two or more bits of data, the memory cell may be prone to a program disturb problem. The program disturb problem is caused by parasitic capacitance between adjacent word lines and floating gates, which are formed closer to each other as fabrication technology develops. Hence, a high voltage applied to one cell during a program operation may shift a program state of an adjacent cell to another program state. Generally, to minimize the program disturb problem in the semiconductor memory device including MLC memory cells, a program operation in a memory block may begin at page 1 corresponding to the first word line WL1, and may be performed sequentially up to page n corresponding to the n-th word line WLn. In other embodiments, the program operation may be sequentially performed in a downward sequence from the n-th word line WLn to the first word line WL1.

If the program operation in the memory block begins at page 1 corresponding to the first word line WL1 and is sequentially performed up to page n corresponding to the n-th word line WLn, if the entirety of one memory block is completely programmed, a subsequent program operation may begin at page 1 of a subsequent memory block.

Figure 3:
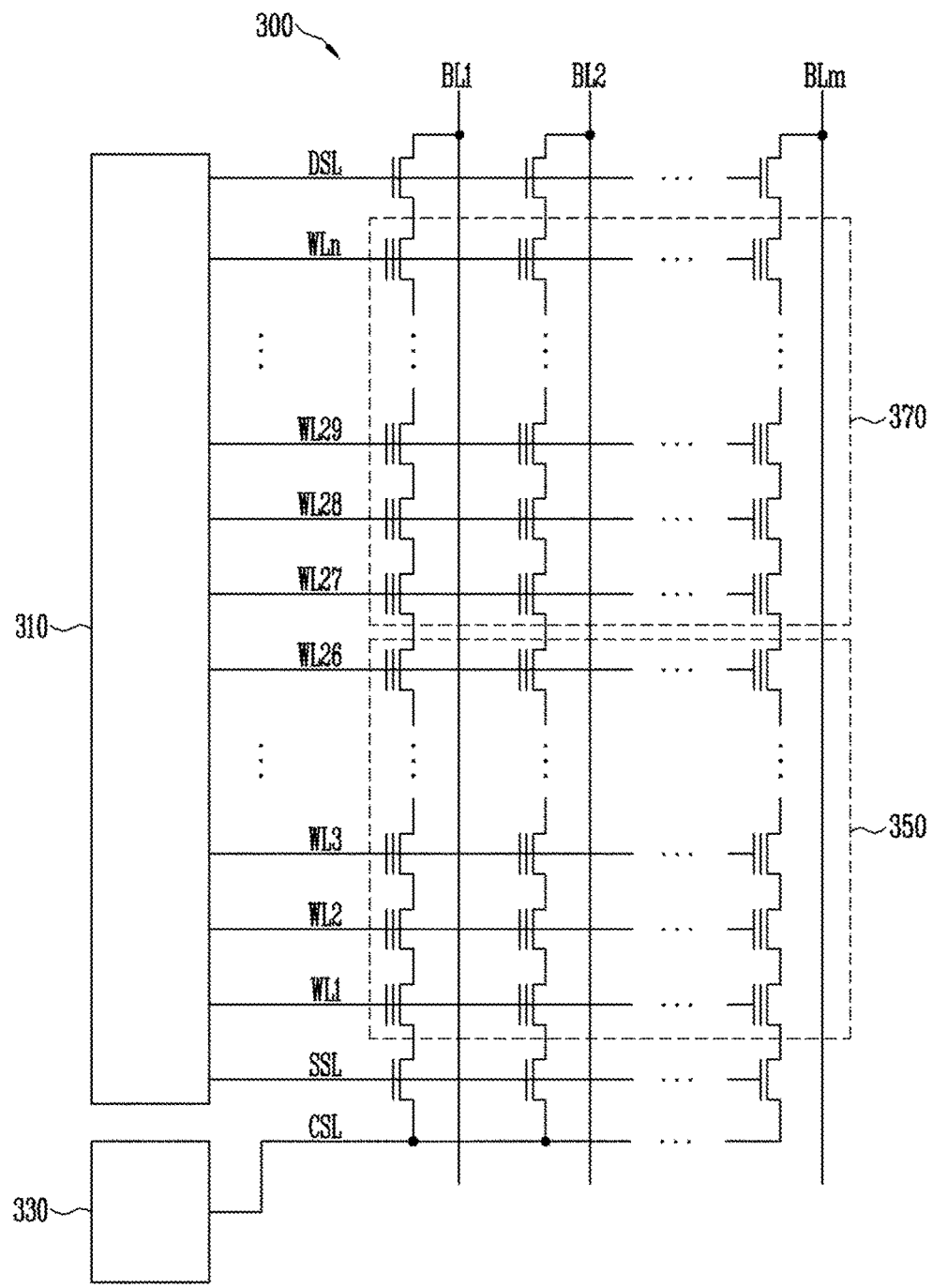
FIG. 3 is a diagram illustrating a configuration of sub-blocks in a memory block.

FIG. 3 is a diagram illustrating a configuration of sub-blocks in the memory block. In detail, FIG. 3 is a schematic circuit diagram illustrating one memory block 300, an address decoder 310, and a source line voltage control unit 330 in a flash memory array. The memory block 300 includes 'm' number of memory cell strings. The memory cell strings are coupled to the corresponding bit line BL1 to BLm and a common source line CSL.

Pages corresponding to the respective word lines WL0 to WLn of the memory block 300 may be programmed in a direction from the first word line WL1 to the n-th word line WLn. In this regard, pages corresponding to the first word line WL1 to the twenty-sixth word lines WL26 may form a first sub-block 350, and pages corresponding to the twenty-seventh word line WL27 to the n-th word line WLn may form a second sub-block 270. That is, in FIG. 3, there is illustrated a case where the memory block includes two sub-blocks 350 and 370. The number of pages included in the first sub-block 350 may be the same as or different than the number of pages included in the second sub-block 370. In an embodiment, the number of pages included in each of the first and second sub-blocks 350 and 370 may be a predetermined fixed value. In another embodiment, the number of pages included in each of the first and second sub-blocks 350 and 370 may vary during an operation. Although FIG. 3 illustrates an embodiment in which the memory block 300 includes two sub-blocks 350 and 370, the memory block may include three or more sub-blocks depending on embodiments.

The memory cells of the memory block 300 may be partially erased. The following description will be based on the assumption that the pages are sequentially programmed in a direction from the first word line WL1 to the n-th word line WLn. In an embodiment in which data is sequentially programmed in a direction from the first word line WL1 to the n-th word line WLn, the first sub-block 350 may be designated as a lower sub-block, and the second sub-block 370 may be designated as an upper sub-block. The lower sub-block includes a lower sequential set of word lines WL1 to WL26, whereas the upper sub-block includes a higher sequential set of word lines WL27 to WLn. Typically, in order to minimize the program disturb program, the upper sub-block, that is, the second sub-block 370, in the memory block 300 may be erased and reprogrammed, whereas data programmed in the lower sub-block may be retained. This scheme is similar to the situation where an erased memory block is sequentially programmed only to a certain page, leaving the remaining pages in the erased state. Therefore, the program disturb problem may be minimized when data is programmed to the erased upper sub-block, that is, the second sub-block 370. However, such a typical method is limited in that, while the lower sub-block may be erased while data is retained in the upper sub-block, data may not be reprogrammed to the lower sub-block until the upper sub-block is erased.

In the case of the present disclosure, an arbitrary sub-block in the memory block may be selected without the above-mentioned limit, and memory cells in the selected sub-block may be erased, wherein a program disturb or erase threshold voltage variation problem with memory cells in an unselected sub-block may be minimized.

Figure 4A:
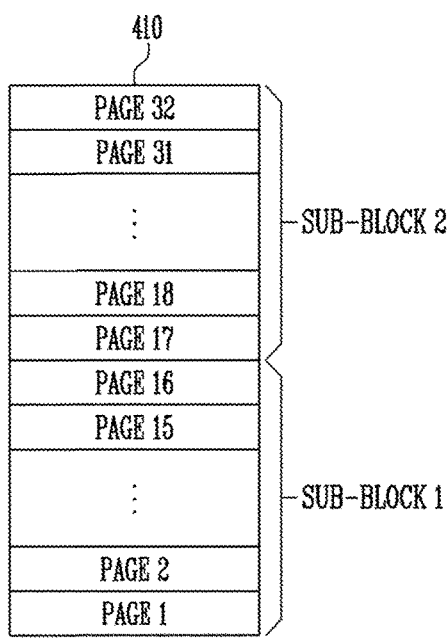
FIG. 4A is a diagram illustrating a first embodiment of a division of a memory block into sub-blocks.
Figure 4B:
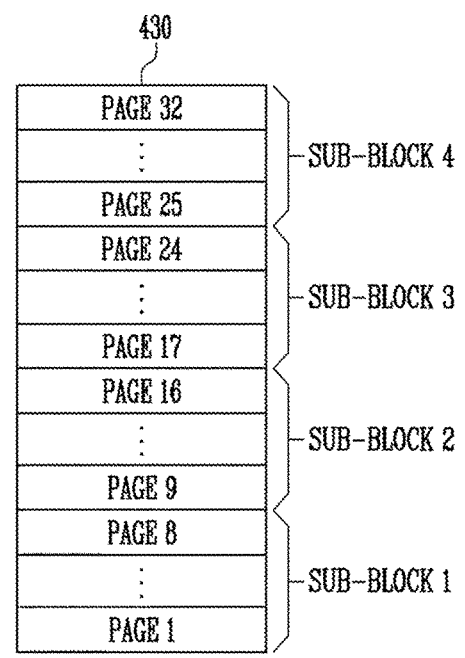
FIG. 4B is a diagram illustrating a second embodiment of a division of a memory block into sub-blocks.

FIG. 4A is a diagram illustrating a first embodiment of the memory block divided into sub-blocks. FIG. 4B is a diagram illustrating a second embodiment of the memory block divided into sub-blocks.

FIG. 4A illustrates an example in which a memory block 410 is divided into two sub-blocks (sub-block 1 and sub-block 2) having the same size. Sub-block 1 includes page 1 to page 16, and sub-block 2 includes page 17 to page 32. The memory block 410 may be sequentially programmed from page 1 to page 32. Each of the pages corresponds to a certain word line, in other words, a page may correspond to one of the first to n-th word lines WL1 to WLn. FIG. 4B illustrates an example in which a memory block 430 is divided into four sub-blocks (sub-block 1, sub-block 2, sub-block 3 and sub-block 4) each having a same size. In another embodiment, the sub-blocks of each of the memory blocks 410 and 430 may have different sizes.

In the embodiment of FIG. 4A, sub-block 1 may be designated as a lower sub-block, and sub-block 2 may be designated as an upper sub-block. In a conventional case, sub-block 1 is programmed before sub-block 2 is programmed. In other words, during a program operation, the control logic 140 may control the memory cell array 110 and the read/write circuit 130 such that the lower or first sub-block is programmed first, and then the second to n-th sub-blocks are sequentially programmed. Furthermore, the conventional case is limited in that, during an erase operation, sub-block 2 must be erased first. However, in the present disclosure, sub-block 1 or sub-block 2 may be arbitrarily erased without the above-mentioned limit. That is, either sub-block 1 or sub-block 2 may be erased regardless of which order sub-block 1 and sub-block 2 are programmed. In this case, in an embodiment, an erase verify voltage may be determined depending on the position of a sub-block to be erased. Alternatively, in another embodiment, an erase verify voltage may be determined based on the program state of a sub-block adjacent to the sub-block to be erased. Consequently, an operation of erasing a sub-block in the memory block may be more reliably performed without limit, whereby the performance of the semiconductor memory device may be enhanced.

In accordance with the present disclosure, an erase verify voltage that is applied when sub-block 1 is erased may differ from an erase verify voltage that is applied when sub-block 2 is erased. For instance, the erase verify voltage that is applied when sub-block 1 is erased may have a value less than the erase verify voltage applied when sub-block 2 is erased. As such, in an embodiment of the present disclosure, an erase verify voltage may be determined depending on the position of a sub-block to be erased.

In accordance with the present disclosure, if sub-block 1 is to be erased, the erase verify voltage may be determined depending on the program state of sub-block 2. For example, when sub-block 1 is to be erased, if sub-block 2 is in an erased state, sub-block 1 may be erased using a first erase verify voltage. Furthermore, if sub-block 2 is in a programmed state, sub-block 2 may be erased using a second erase verify voltage. The first erase verify voltage may have a value different from the second erase verify voltage.

For example, when sub-block 2 is to be erased, if sub-block 1 is in an erased state, sub-block 2 may be erased using a third erase verify voltage. Furthermore, if sub-block 1 is in a programmed state, sub-block 2 may be erased using a fourth erase verify voltage. The third erase verify voltage may have a value different from the fourth erase verify voltage. In one embodiment, the FIG. 5 is a flowchart showing a method of operating a semiconductor memory device in accordance with an embodiment of the present disclosure.

Figure 5:
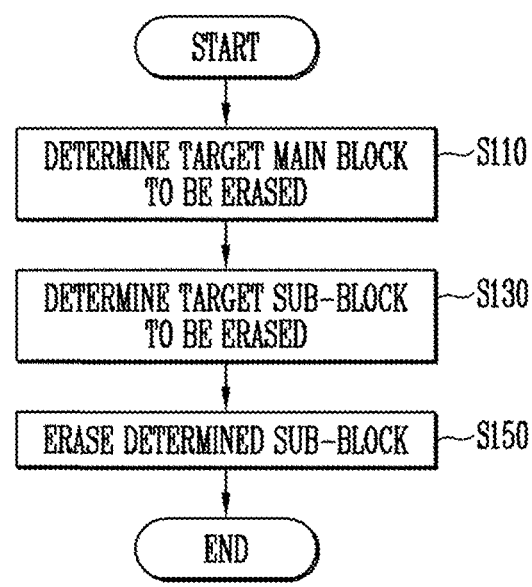
FIG. 5 is a flowchart showing a method of operating a semiconductor memory device in accordance with an embodiment of the present disclosure.

Referring to FIG. 5, a method of operating a semiconductor memory device in accordance with an embodiment of the present disclosure includes step S110 of determining a target main block to be erased, step S130 of determining a target sub-block to be erased, and step S150 of erasing the determined sub-block.

At the step S110 of determining the target main block to be erased, among the plurality of memory blocks in the memory cell array of the semiconductor memory device, a memory block for which an erase operation is to be performed is selected. The main block may refer to a memory block for which the erase operation is to be performed. In other words, in this specification, the term "main block" has a concept contrary to a sub-block and is used as a term to denote a memory block including a plurality of sub-blocks.

At the step S130 of determining the target sub-block to be erased among a plurality of sub-blocks in the memory block selected as a target to be erased at step S110, a sub-block for which an erase operation is to be performed is determined. In accordance with a method of operating the semiconductor memory device according to an embodiment of the present disclosure, the control logic 140 may select a target sub-block to be erased regardless of a program sequence of the sub-blocks in the main block. Further, the control logic 140 may also determine an erase verify voltage for the sub-block to be erased based on at least one of the position of the sub-block or the program state of an adjacent sub-block. Therefore, variation in threshold voltages of the memory cells due to a disturb phenomenon during an erase operation may be minimized, and a limit in selecting the sub-block during the erase operation is removed. As a result, the performance of the semiconductor memory device may be enhanced.

At the step S150 of erasing the determined sub-block, an operation of erasing the selected sub-block through a plurality of erase loops using a predetermined erase verify voltage may be performed. To prevent a disturb problem during an erase operation, at step S150, an erase verify voltage for the operation of erasing the selected sub-block may be determined. In an embodiment, the erase verify voltage may be determined depending on a relative position of the target sub-block to be erased. A detailed process of determining the erase verify voltage depending on the relative position of the target sub-block to be erased will be described later herein with reference to FIG. 6. In another embodiment, the erase verify voltage may be determined based on the program states of other unselected sub-blocks adjacent to the target sub-block to be erased. A detailed process of determining the erase verify voltage based on the program states of the unselected sub-blocks will be described later herein with reference to FIG. 7.

Figure 6:
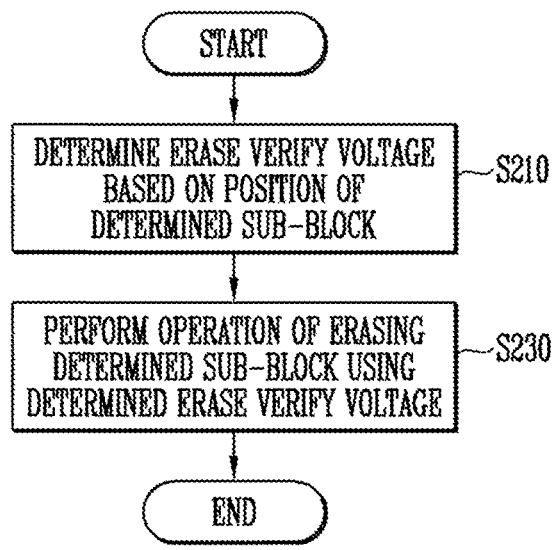
FIG. 6 is a flowchart showing in detail a first embodiment of a step of erasing a determined sub-block in the embodiment shown in FIG. 5.

FIG. 6 is a flowchart showing in detail a first embodiment of the step of erasing the determined sub-block in the embodiment shown in FIG. 5.

Referring to FIG. 6, the step of erasing the determined sub-block includes step S210 of determining an erase verify voltage based on the position of the determined sub-block, and a step S230 of performing an operation of erasing the determined sub-block based on the determined erase verify voltage.

At the step S210 of determining the erase verify voltage based on the position of the determined sub-block, the erase verify voltage may be determined based on the relative position of the target sub-block to be erased. For example, referring to FIG. 4A, the erase verify voltage of sub-block 1 (the lower sub-block) may have a value less than the erase verify voltage of sub-block 2 (the upper sub-block). In this case, at step S210, the control logic 140 of FIG. 1 may determine whether the target sub-block to be erased is sub-block 1 or sub-block 2, and then determine the erase verify voltage corresponding to the associated sub-block as the erase verify voltage to be used for the erase operation.

In another embodiment, referring to FIG. 4B, the sub-blocks are arranged in a sequence of sub-block 1, sub-block 2, sub-block 3, and sub-block 4. In this case, the erase verify voltage of sub-block 1 that is disposed at the lowermost position is least. As the relative position of the sub-block increases, the erase verify voltage thereof may also increase. In other words, the erase verify voltage of the sub-blocks may gradually increase from an erase verify voltage of sub-block 1, to an erase verify voltage of sub-block 2 which is higher than the erase verify voltage of sub-block 1, to an erase verify voltage of sub-block 3 which is higher than the erase verify voltage of sub-block 2, and an erase verify voltage of sub-block 4 which is higher than the erase verify voltage of sub-block 3. In this case, at step S210, the control logic 140 of FIG. 1 may determine which sub-block of sub-block 1 to sub-block 4 is the target sub-block to be erased, and then determine the erase verify voltage based on a position of the sub-block as the erase verify voltage to be used for the erase operation.

At step S230, the operation of erasing the selected sub-block may be performed based on the determined erase verify voltage. In this case, erase loops for the memory cells in the selected block may be performed multiple times using the erase verify voltage.

According to a method of operating the semiconductor memory device in accordance with an embodiment of the present disclosure, the target sub-block to be erased is selected regardless of a program sequence of the sub-blocks in the memory block, and the erase verify voltage is determined based on the relative position of the target sub-block to be erased. Therefore, during an erase operation, variation in threshold voltages of memory cells disposed adjacent to each other may be minimized. As a result, the performance of the semiconductor memory device may be enhanced.

Figure 7:
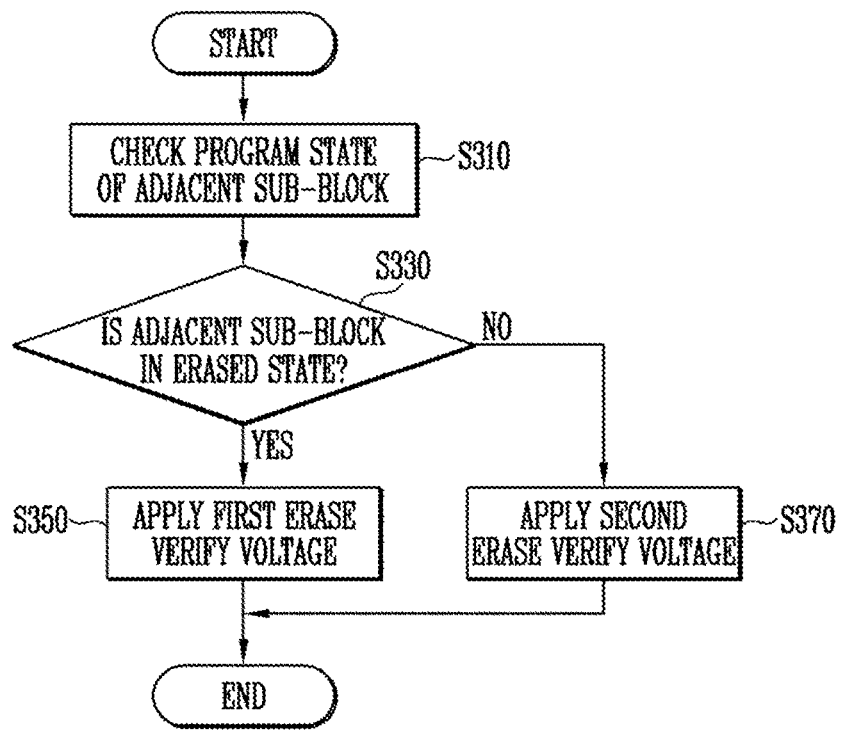
FIG. 7 is a flowchart showing in detail a second embodiment of a step of erasing a determined sub-block in the embodiment shown in FIG. 5.

FIG. 7 is a flowchart showing in detail a second embodiment of a step of erasing the determined sub-block in the embodiment shown in FIG. 5.

Referring to FIG. 7, the step of erasing the determined sub-block includes step S310 of checking the program state of an adjacent sub-block, step S330 of determining whether the adjacent sub-block is in an erased state, step S350 of applying the first erase verify voltage when the adjacent sub-block is in the erased state, and step S370 of applying a second erase verify voltage when the adjacent sub-block is not in the erased state.

At the step S310 of checking the program state of the adjacent sub-block, the program state of an unselected sub-block disposed adjacent to the sub-block that is selected as the target sub-block to be erased is checked. Referring together to FIG. 4A, for example, if sub-block 1 is selected as the target sub-block to be erased, the program state of sub-block 2 is checked, at step S310. If sub-block 2 is selected as the target sub-block to be erased, the program state of sub-block 1 is checked, at step S310.

Referring to FIG. 4B, if sub-block 4 is selected as the target sub-block to be erased, the program state of sub-block 3 is checked, at step S310. If sub-block 1 is selected as the target sub-block to be erased, the program state of sub-block 2 is checked, at step S310.

If sub-block 2 is selected as the target sub-block to be erased, the program state of sub-block 1 adjacent to sub-block 2 may be checked, at step S310. Alternatively, the program state of sub-block 3 adjacent to sub-block 2 may be checked. As a further alternative, the program states of both sub-block 1 and sub-block 3 may be checked.

In another embodiment, if sub-block 3 is selected as the target sub-block to be erased, the program state of sub-block 4 adjacent to sub-block 3 may be checked, at step S310. Alternatively, the program state of sub-block 2 adjacent to sub-block 3 may be checked. As a further alternative, the program states of both sub-block 2 and sub-block 4 may be checked.

At step S330 of determining whether an adjacent sub-block is in the erased state, the control logic 140 shown in FIG. 1 may determine the erase verify voltage for erasing a selected sub-block depending on whether an unselected sub-block adjacent to the selected sub-block is in a programmed state. For example, referring together to FIG. 4A, if sub-block 1 is selected as the target sub-block to be erased and sub-block 2 is in an erased state and therefore is not in a programmed state, the first erase verify voltage may be determined as the erase verify voltage of sub-block 1. If sub-block 1 is selected as the target sub-block to be erased and sub-block 2 is in a programmed state, the second erase verify voltage may be determined as the erase verify voltage of sub-block 1. Even in the case of the embodiment of FIG. 4B in which the four sub-blocks are included in the memory bock, the erase verify voltage may be determined depending on the program state of an adjacent sub-block.

Depending on a determination result at step S330, the erase operation may be performed by applying the first erase verify voltage to the selected sub-block, at step S350, or the erase operation may be performed by applying the second erase verify voltage to the selected sub-block, at step S370. The first erase verify voltage, the second erase verify voltage, and the third erase verify voltage may have different values. Furthermore, the first erase verify voltage and the second erase verify voltage may be selected such that during the erase operation, variation in threshold voltages of memory cells disposed adjacent to each other may be minimized. In an embodiment, if adjacent sub-blocks are present both over and under the selected sub-block, if both the adjacent sub-blocks are in the erased states, the control logic 140 shown in FIG. 1 may determine the first erase verify voltage as the erase verify voltage for erasing the selected sub-block. If both the adjacent sub-blocks are in programmed states, the control logic 140 may determine the second erase verify voltage as the erase verify voltage for erasing the selected sub-block. If either one of the adjacent sub-blocks is in a programmed state and the other adjacent sub-block is in an erased state, the control logic 140 may determine the third erase verify voltage as the erase verify voltage for erasing the selected sub-block. In this regard, the first erase verify voltage may have a value greater than the second erase verify voltage, and the second erase verify voltage may have a value greater than the third erase verify voltage.

According to a method of operating the semiconductor memory device in accordance with an embodiment of the present disclosure, the target sub-block to be erased is selected regardless of a program sequence of the sub-blocks in the memory block, and the erase verify voltage is determined based on the program states of unselected sub-blocks adjacent to the target sub-block to be erased. Therefore, during an erase operation, variation in threshold voltages of memory cells disposed adjacent to each other may be minimized. As a result, the performance of the semiconductor memory device may be enhanced.

Figure 8:
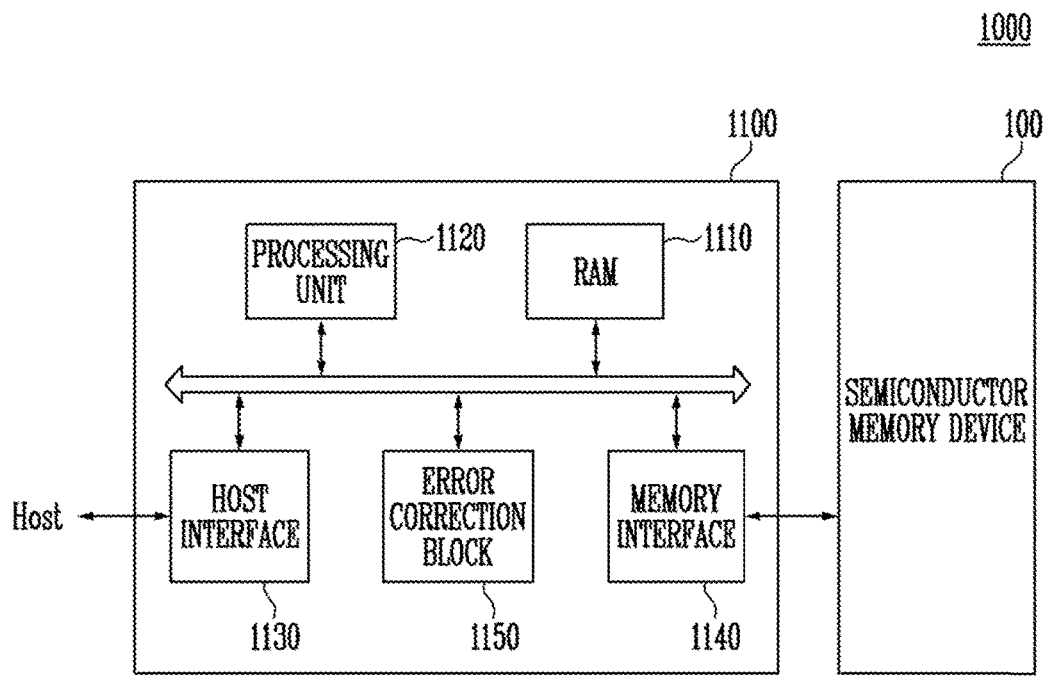
FIG. 8 is a block diagram illustrating a memory system including the semiconductor memory device of FIG. 1.

FIG. 8 is a block diagram showing a memory system including the semiconductor memory device of FIG. 1.

Referring FIG. 8, the memory system 1000 includes the semiconductor memory device 100 and a controller 1100. The semiconductor memory device 100 may be the semiconductor memory device described with reference to FIG. 1. Hereinafter, repetitive explanations will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, or a buffer memory between the semiconductor memory device 100 and the host Host. The processing unit 1120 controls the overall operation of the controller 1100. In addition, the controller 1100 may temporarily store program data provided from the host Host during a write operation.

The host interface 1130 includes a protocol for performing data exchange between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), an SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
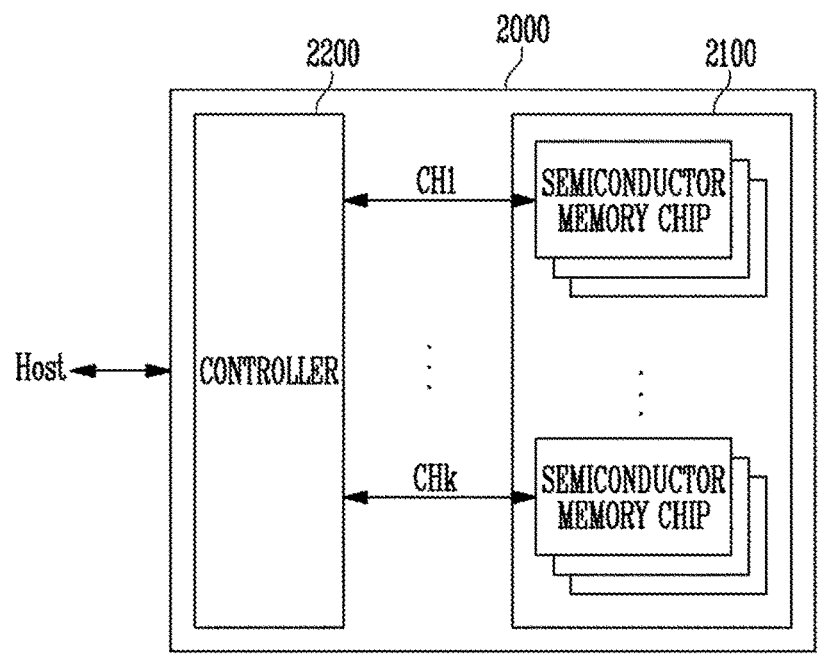
FIG. 9 is a block diagram illustrating an example application of the memory system of FIG. 8.

FIG. 9 is a block diagram showing an example application of the memory system of FIG. 8.

Referring to FIG. 9, the memory system 2000 includes a semiconductor memory device 2100 and a controller 2200. The semiconductor memory device 2100 includes a plurality of memory chips. The semiconductor memory chips are divided into a plurality of groups.

In FIG. 9, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 8 and is configured to control a plurality of memory chips of the semiconductor memory device 2100 through the plurality of channels CH1 to CHk.

Figure 10:
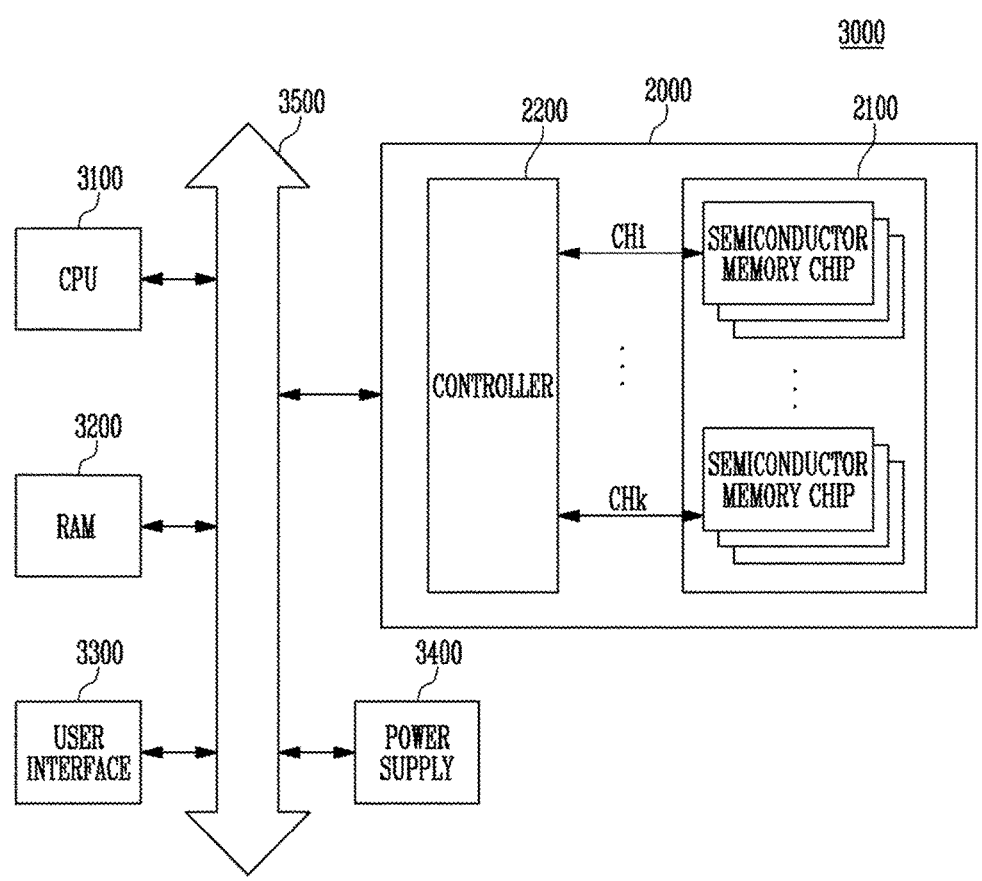
FIG. 10 is a block diagram illustrating a computing system including the memory system illustrated with reference to FIG. 9.

FIG. 10 is a block diagram illustrating a computing system including the memory system illustrated with reference to FIG. 9.

The computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 10, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 10, the memory system 2000 described with reference to FIG. 9 is illustrated as being used. However, the memory system 2000 may be replaced with the memory system 1000 described with reference to FIG. 8. In an embodiment, the computing system 3000 may include all of the memory systems 1000 and 2000 described with reference to FIGS. 8 and 9.

According to a semiconductor memory device and a method of operating the same in accordance with an embodiment of the present disclosure, a sub-block in a memory block may be erased regardless of a sequence in which sub-blocks have been programmed. Therefore, there is no limit in selecting a target sub-block during an erase operation, whereby the performance of the semiconductor memory device may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array including a plurality of memory cells;
a read/write circuit configured to write data to the memory cell array or read data from the memory cell array; and
a control logic configured to control the read/write circuit to perform a read/write operation for the memory cell array,
wherein the memory cell array includes a plurality of memory blocks, and each of the memory blocks includes a plurality of sub-blocks including a first sub-block and a second sub-block, and
wherein, during an operation of erasing a sub-block in a memory block, the control logic selects a sub-block to be erased regardless of a sequence in which the sub-blocks have been programmed, and determines an erase verify voltage based on a position of the selected sub-block, and
wherein the control logic determines the erase verify voltage such that an erase verify voltage for erasing the first sub-block is different to an erase verify voltage for erasing the second sub-block.

2. The semiconductor memory device according to claim 1,
wherein each of the memory blocks includes two sub-blocks,
wherein the two sub-blocks include an upper sub-block and a lower sub-block, and
wherein the upper sub-block corresponds to the first sub-block, and the lower sub-block corresponds to the second sub-block.

3. The semiconductor memory device according to claim 2, wherein the control logic determines the erase verify voltage such that an erase verify voltage for erasing the upper sub-block is greater than an erase verify voltage for erasing the lower sub-block.

4. The semiconductor memory device according to claim 2, wherein, during the operation of erasing the selected sub-block, the control logic determines the erase verify voltage for the operation of erasing the selected sub-block, based on a program state of an unselected sub-block.

5. The semiconductor memory device according to claim 4, wherein the unselected sub-block is adjacent to the selected sub-block.

6. The semiconductor memory device according to claim 2, wherein:
the lower sub-block is erased using a first erase verify voltage if the upper sub-block is in an erased state, and the lower sub-block is erased using a second erase verify voltage if the upper sub-block is in a programmed state, where the first erase verify voltage is different from the second erase verify voltage; and
the upper sub-block is erased using a third erase verify voltage if the lower sub-block is in the erased state, and the upper sub-block is erased using a fourth erase verify voltage if the lower sub-block is in the programmed state, where the third erase verify voltage is different from the fourth erase verify voltage.

7. The semiconductor memory device according to claim 1,
wherein each of the memory blocks includes first to N-th sub-blocks (N is a natural number of 2 or more), and
wherein, during a program operation, the control logic controls the memory cell array and the read/write circuit such that the first sub-block is programmed first, and then the second to N-th sub-blocks are sequentially programmed.

8. The semiconductor memory device according to claim 7, wherein erase verify voltages corresponding to the first to N-th sub-blocks are increased from the first sub-block to the N-th sub-block.

9. The semiconductor memory device according to claim 7,
wherein, during the operation of erasing the selected sub-block, the control logic determines a first erase verify voltage as the erase verify voltage for the operation of erasing the selected sub-block when, among unselected sub-blocks, both sub-blocks adjacent to the selected sub-block are in an erased state,
wherein the control logic determines a second erase verify voltage as the erase verify voltage for the operation of erasing the selected sub-block when both the sub-blocks adjacent to the selected sub-block are in programmed states,
wherein the control logic determines a third erase verify voltage as the erase verify voltage for the operation of erasing the selected sub-block when either one of the sub-blocks adjacent to the selected sub-block is in the erased state and the other sub-block adjacent to the selected sub-block is in a programmed state, and wherein the first erase verify voltage is greater than the second erase verify voltage, and the second erase verify voltage is greater than the third erase verify voltage.

10. The semiconductor memory device according to claim 7, wherein the sub-blocks have a same size.

11. The semiconductor memory device according to claim 7, wherein the sub-blocks each have a different size.

12. A method for operating a semiconductor memory device including a plurality of memory blocks each of which is divided into a plurality of sub-blocks including a first sub-block and a second sub-block, the method comprising:

determining a target memory block to be erased;

determining a target sub-block to be erased in the determined memory block;

determining an erase verify voltage of the determined sub-block, the erase verify voltage being determined such that an erase verify voltage for erasing the first sub-block is different to an erase verify voltage for erasing the second sub-block; and erasing the determined sub-block using the determined erase verify voltage.

13. The method according to claim 12, wherein the determining of the target sub-block to be erased comprises selecting the sub-block to be erased, regardless of a sequence in which the sub-blocks have been programmed in the target memory block to be erased.

14. The method according to claim 12, wherein each of the plurality of memory blocks includes an upper sub-block and a lower sub-block, the upper sub-block corresponds to the first sub-block, and the lower sub-block corresponds to the second sub-block, and wherein the determining of the erase verify voltage comprises determining the erase verify voltage such that an erase verify voltage for erasing the upper sub-block is greater than an erase verify voltage for erasing the lower sub-block.

15. The method according to claim 12, wherein each of the plurality of memory blocks includes an upper sub-block and a lower sub-block, the upper sub-block corresponds to the first sub-block, and the lower sub-block corresponds to the second sub-block, and wherein the determining of the erase verify voltage comprises determining the erase verify voltage for an operation of erasing the determined sub-block, based on a program state of an unselected sub-block.

16. The method according to claim 15, further comprising:

determining a first erase verify voltage as the determined erase verify voltage for erasing the target sub-block when, among unselected sub-blocks, both unselected sub-blocks adjacent to the target sub-block are in an erased state;

determining a second erase verify voltage as the determined erase verify voltage for erasing the target sub-block when both unselected sub-blocks adjacent to the target sub-block are in programmed states; and determining a third erase verify voltage as the determined erase verify voltage for erasing the target sub-block when either one of the unselected sub-blocks adjacent to the target sub-block is in the erased state and the other sub-block adjacent to the target sub-block is in the programmed state.

17. The method according to claim 16, wherein the first erase verify voltage is greater than the second erase verify voltage, and the second erase verify voltage is greater than the third erase verify voltage.

* * * * *